(12) United States Patent
Kwon et al.

(10) Patent No.: US 9,754,892 B2
(45) Date of Patent: Sep. 5, 2017

(54) STACKED SEMICONDUCTOR PACKAGE AND MANUFACTURING METHOD THEREOF

(71) Applicant: NEPES CO., LTD., Eumseong-gun, Chungcheongbuk-do (KR)

(72) Inventors: Yong-Tae Kwon, Suwon-si (KR); Jun-Kyu Lee, Chungcheongbuk-do (KR)

(73) Assignee: NEPES CO., LTD. (KR)

( * ) Notice: Subject to any disclaimer, the term of this patent is extended or adjusted under 35 U.S.C. 154(b) by 34 days.

(21) Appl. No.: 14/369,807

(22) PCT Filed: Dec. 28, 2012

(86) PCT No.: PCT/KR2012/011769
§ 371 (c)(1),
(2) Date: Jun. 30, 2014

(87) PCT Pub. No.: WO2013/100710
PCT Pub. Date: Jul. 4, 2013

(65) Prior Publication Data
US 2015/0137346 A1      May 21, 2015

(30) Foreign Application Priority Data

Dec. 29, 2011  (KR) ........................ 10-2011-0145519

(51) Int. Cl.
*H01L 23/34* (2006.01)
*H01L 23/538* (2006.01)
(Continued)

(52) U.S. Cl.
CPC ........ *H01L 23/5389* (2013.01); *H01L 21/565* (2013.01); *H01L 24/19* (2013.01);
(Continued)

(58) Field of Classification Search
CPC ............ H01L 2224/01; H01L 2224/03; H01L 2224/10; H01L 25/00; H01L 2225/06541;
(Continued)

(56) References Cited

U.S. PATENT DOCUMENTS 6,958,544 B2 * 10/2005 Sunohara .............. H01L 21/304
257/758
7,247,518 B2 * 7/2007 Shibata ............... H01L 23/5389
257/E21.705
(Continued)

FOREIGN PATENT DOCUMENTS

| CN | 101330068 A | 12/2008 |
| KR | 20070006327 A | 1/2007 |

(Continued)

*Primary Examiner* — Tod T Van Roy
*Assistant Examiner* — Delmar R Forde

(57) ABSTRACT

Disclosed herein is a stacked semiconductor package in which semiconductor chips having various sizes are stacked. In accordance with one aspect of the present disclosure, a stacked semiconductor package includes a first semiconductor chip structure provided with a first semiconductor chip, a first mold layer surrounding the first semiconductor chip, and a first penetration electrode passing through the first mold layer and electrically connected to the first semiconductor chip, and a second semiconductor chip structure vertically stacked on the first semiconductor chip structure and provided with a second semiconductor chip and a second penetration electrode electrically connected to the first penetration electrode, wherein the first semiconductor chip structure may have the same size as the second semiconductor chip structure.

17 Claims, 9 Drawing Sheets

(51) Int. Cl.
*H01L 25/065* (2006.01)
*H01L 23/00* (2006.01)
*H01L 21/56* (2006.01)
*H01L 23/31* (2006.01)

(52) U.S. Cl.
CPC .............. *H01L 24/24* (2013.01); *H01L 24/82* (2013.01); *H01L 25/0657* (2013.01); H01L 23/3128 (2013.01); H01L 2224/02372 (2013.01); H01L 2224/02375 (2013.01); H01L 2224/02379 (2013.01); H01L 2224/0345 (2013.01); H01L 2224/0346 (2013.01); H01L 2224/0401 (2013.01); H01L 2224/04105 (2013.01); H01L 2224/05548 (2013.01); H01L 2224/05624 (2013.01); H01L 2224/05647 (2013.01); H01L 2224/06182 (2013.01); H01L 2224/1134 (2013.01); H01L 2224/12105 (2013.01); H01L 2224/16145 (2013.01); H01L 2224/16227 (2013.01); H01L 2224/24 (2013.01); H01L 2224/82 (2013.01); H01L 2225/06513 (2013.01); H01L 2225/06517 (2013.01); H01L 2225/06527 (2013.01); H01L 2225/06541 (2013.01); H01L 2225/06548 (2013.01); H01L 2225/06565 (2013.01); H01L 2924/15311 (2013.01); H01L 2924/181 (2013.01); H01L 2924/18162 (2013.01)

(58) Field of Classification Search
CPC ....... H01L 2225/06548; H01L 25/0657; H01L 23/5389; H01L 24/24; H01L 24/82; H01L 2224/82; H01L 2224/24; H01L 24/04–24/09; H01L 24/12–24/17; H01L 23/5226; H01L 23/5384
USPC .......... 257/678–796; 438/106–127, 455–458, 438/667
See application file for complete search history.

(56) References Cited

U.S. PATENT DOCUMENTS

| | | | | |
|---|---|---|---|---|
| 8,022,555 B2* | 9/2011 | Hwang | ................. | H01L 23/481 257/673 |
| 8,421,244 B2* | 4/2013 | Hwang | ................. | H01L 23/481 257/673 |
| 8,766,456 B2* | 7/2014 | Hsu et al. | ..................... | 257/774 |
| 8,823,180 B2* | 9/2014 | Wang et al. | ................. | 257/775 |
| 2005/0212126 A1* | 9/2005 | Sunohara | .............. | H01L 21/304 257/730 |
| 2007/0007641 A1* | 1/2007 | Lee et al. | ...................... | 257/691 |
| 2007/0176275 A1* | 8/2007 | Singleton et al. | ............. | 257/686 |
| 2008/0138934 A1* | 6/2008 | Kim | .................. | H01L 23/49816 438/109 |
| 2009/0302435 A1* | 12/2009 | Pagaila et al. | ................. | 257/659 |
| 2010/0072606 A1 | 3/2010 | Yang et al. | | |
| 2010/0081236 A1* | 4/2010 | Yang et al. | ................... | 438/119 |
| 2011/0024890 A1* | 2/2011 | Yang et al. | ................... | 257/686 |
| 2011/0278741 A1* | 11/2011 | Chua et al. | ................... | 257/777 |
| 2012/0049334 A1* | 3/2012 | Pagaila et al. | ................. | 257/666 |
| 2012/0056312 A1* | 3/2012 | Pagaila et al. | ................. | 257/684 |
| 2012/0146216 A1* | 6/2012 | Kang et al. | ................... | 257/737 |
| 2012/0193779 A1* | 8/2012 | Lee | ...................... | H01L 23/3135 257/737 |
| 2012/0211885 A1* | 8/2012 | Choi | .................. | H01L 23/3128 257/737 |
| 2013/0026643 A1* | 1/2013 | England et al. | ............... | 257/774 |
| 2013/0037936 A1* | 2/2013 | Choi et al. | .................... | 257/737 |
| 2013/0037950 A1* | 2/2013 | Yu et al. | ........................ | 257/738 |
| 2013/0069239 A1* | 3/2013 | Kim et al. | ...................... | 257/774 |
| 2013/0075924 A1* | 3/2013 | Lin et al. | ....................... | 257/774 |
| 2013/0105973 A1* | 5/2013 | Gan et al. | ...................... | 257/738 |
| 2014/0264928 A1* | 9/2014 | Lin et al. | ....................... | 257/774 |
| 2015/0001685 A1* | 1/2015 | Chung | .................. | H01L 21/486 257/621 |
| 2015/0021784 A1* | 1/2015 | Lin | ....................... | H01L 23/481 257/774 |
| 2015/0108653 A1* | 4/2015 | Hooper | ................... | B81B 7/007 257/774 |
| 2015/0249068 A1* | 9/2015 | Ye | ...................... | H01L 25/0657 257/737 |
| 2015/0262708 A1* | 9/2015 | Lee | ....................... | H01L 23/481 365/191 |
| 2015/0318261 A1* | 11/2015 | Chung | ................ | H01L 25/0652 257/774 |

FOREIGN PATENT DOCUMENTS

| | | |
|---|---|---|
| KR | 20080051203 A | 6/2008 |
| KR | 20080064090 A | 7/2008 |
| KR | 20100133303 A | 12/2010 |

* cited by examiner

[Fig. 15]
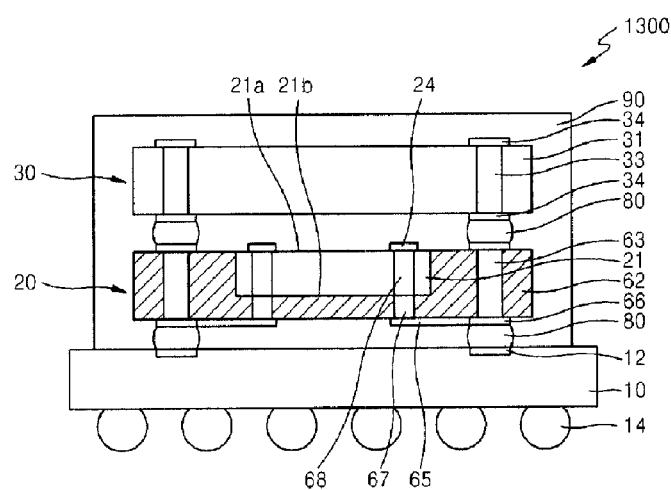
[Fig. 16]
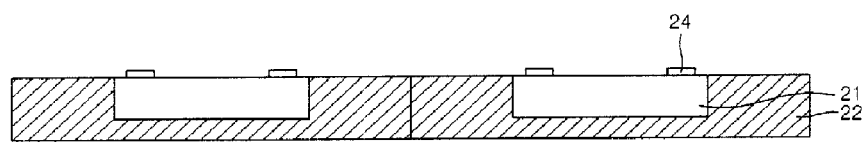

[Fig. 17]
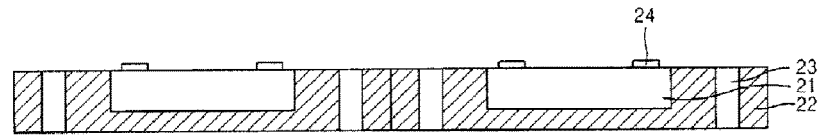
[Fig. 18]
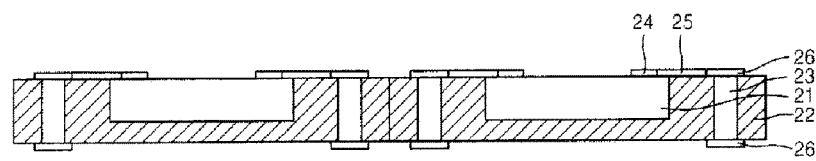
[Fig. 19]
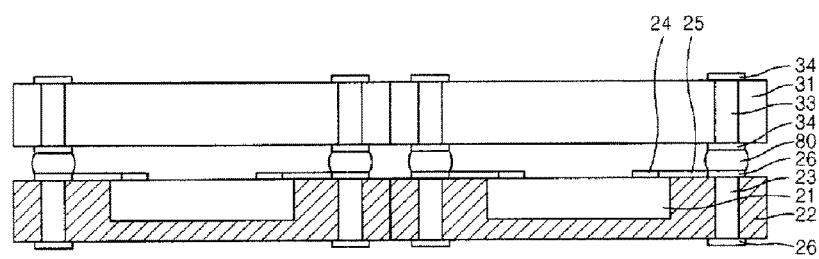
[Fig. 20]
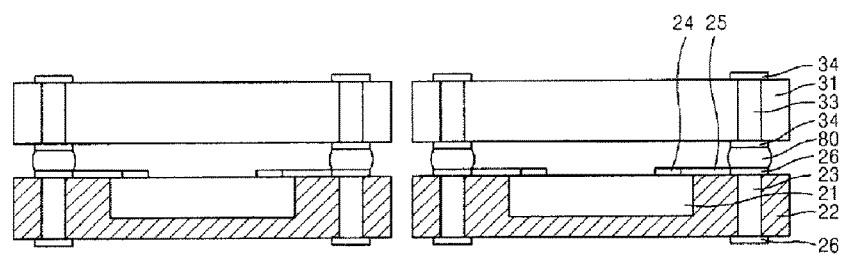
[Fig. 21]
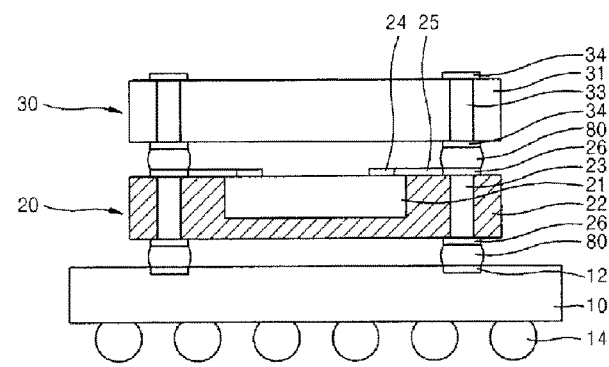

STACKED SEMICONDUCTOR PACKAGE AND MANUFACTURING METHOD THEREOF

TECHNICAL FIELD

Embodiments of the present disclosure relate to a semiconductor package, more particularly a stacked semiconductor package in which semiconductor chips having various sizes are stacked and a manufacturing method thereof.

BACKGROUND ART

In recent years, as for semiconductor components, due to the miniaturization of a processing technology and the diversification of functions, the size of chip is miniaturized and the number of input/output ports are increased so that an electrode pad pitch is miniaturized more and more. In addition, since the fusion of various functions is accelerated, a system level packaging technology, which is a plurality of elements are integrated in a single package, is on the rise. The system level packaging technology has been changed to be a three dimensional stacking technique, which can keep a short signal length in order to minimize a noise between operations and to improve a signal speed. On the other hand, because of the requirements of the improvement of these techniques, and the high productivity and the reduction of the manufacturing cost to control the rise in product prices, a stacked package that is formed by stacking a plurality of semiconductor chips have been introduced.

In order to implement the stacked package, it is desirable that semiconductor chips stacked in a single package have the same size. When the semiconductor chips stacked in the single package have different sizes to each other, particularly, a semiconductor chip disposed on the lower side have a smaller size than that of a semiconductor chip disposed on the upper side, it is not easy to stack semiconductor chips. Korean Patent Publication No. 2005-0048323, published May. 24, 2005, discloses a semiconductor package in which semiconductor chips having the same size are stacked. In the above patent, a semiconductor chip having a relatively small size is adjusted to the same size as that of the semiconductor chip having a relatively large size by adding a peripheral region to the semiconductor chip having a relatively small size. However, since the peripheral region thereof is provided by a wafer forming the semiconductor chip, the yield of semiconductor chips per wafer may be reduced, and there may be difficulties to apply to the semiconductor chips of various sizes.

DISCLOSURE

Technical Problem

Therefore, it is an aspect of the present disclosure to a stacked semiconductor package capable of staking easily semiconductor chips having various sizes.

It is another aspect of the present disclosure to provide a manufacturing method of the stacked semiconductor package.

Additional aspects of the present disclosure will be set forth in part in the description which follows and, in part, will be obvious from the description, or may be learned by practice of the invention.

Technical Solution

In accordance with one aspect of the present disclosure, a stacked semiconductor package includes a first semiconductor chip structure provided with a first semiconductor chip, a first mold layer surrounding the first semiconductor chip, and a first penetration electrode passing through the first mold layer and electrically connected to the first semiconductor chip, and a second semiconductor chip structure vertically stacked on the first semiconductor chip structure and provided with a second semiconductor chip and a second penetration electrode electrically connected to the first penetration electrode, wherein the first semiconductor chip structure may have the same size as the second semiconductor chip structure.

At least one side of the first mold layer may have the same size as at least one side of the second semiconductor chip structure.

One side of the first semiconductor chip may have the same size as one side of the second semiconductor chip.

The first semiconductor chip structure may be stacked to be disposed on the upper side of the second semiconductor chip structure.

The second semiconductor chip structure may be stacked to be disposed on the upper side of the first semiconductor chip structure.

An active surface of the first semiconductor chip may be disposed to face the second semiconductor chip.

An active surface of the first semiconductor chip may be disposed to be opposite to the second semiconductor chip.

The first penetration electrode and the second penetration electrode may be disposed on the same position.

The first semiconductor chip may include a first chip pad, and the first semiconductor chip structure may further include a rerouting pattern configured to connect the first chip pad of the first semiconductor chip to the first penetration electrode and formed on the first mold layer.

The second semiconductor chip structure may further include a second mold layer surrounding the second semiconductor chip.

The stacked semiconductor package may further include a third semiconductor chip structure vertically stacked on the first semiconductor chip structure or the second semiconductor chip structure, wherein the third semiconductor chip structure may have the same size as the first semiconductor chip structure or the second semiconductor chip structure.

The third semiconductor chip structure may include a third semiconductor chip, a third mold layer surrounding the third semiconductor chip, and a third penetration electrode passing through the third mold layer.

The third semiconductor chip may have a different size from at least one of the first semiconductor chip and the second semiconductor chip.

In accordance with another aspect of the present disclosure, a manufacturing method for a stacked semiconductor package includes forming a first mold layer surrounding a first semiconductor chip, forming a first penetration electrode passing through the first mold layer, forming a stacked semiconductor package by forming a rerouting pattern on the first mold layer to connect the first penetration electrode to the first chip pad, stacking a second semiconductor chip structure having a second semiconductor chip and a second penetration electrode on the first semiconductor chip structure, and electrically connecting the first penetration electrode of the first semiconductor chip structure to the second penetration electrode of the second semiconductor chip structure, wherein the first semiconductor chip structure may have the same size as the second semiconductor chip structure.

Advantageous Effects

As is apparent from the above description, according to the proposed stacked semiconductor package, it may be possible to adjust stacked semiconductor chips so that the stacked semiconductor chips have the same size by forming a semiconductor chip structure in which a small semiconductor chip has the same size as a big semiconductor chip by forming a mold layer surrounding the small semiconductor.

The mold layer is applied to separate semiconductor chips, so that the size of semiconductor chips having various sizes may be adjusted to facilitate.

A stacked semiconductor package may be realized without changing a wafer design for different kinds of semiconductor devices so that fusion of semiconductor devices of various applications is obtained.

The implementation at wafer level is possible so that the manufacturing cost may be reduced and the productivity may be improved. There is design flexibility in a stacked direction of an upper surface or a lower surface of a semiconductor chip device, the stacking structure with high reliability may be realized depending on the field of application of the package. Different kinds of semiconductor device are easily stacked by using a panel or a substrate as an interposer, that is, mediator, by using rearranging chip.

DESCRIPTION OF DRAWINGS

These and/or other aspects of the disclosure will become apparent and more readily appreciated from the following description of embodiments, taken in conjunction with the accompanying drawings of which:

FIGS. 14 to 15 are cross-sectional views illustrating stacked semiconductor packages in accordance with one embodiment of the present disclosure.

FIGS. 16 to 21 are cross-sectional views illustrating the step of a manufacturing method of the stacked semiconductor package of FIG. 1 in accordance with one embodiment of the present disclosure.

BEST MODE

Figure 1:
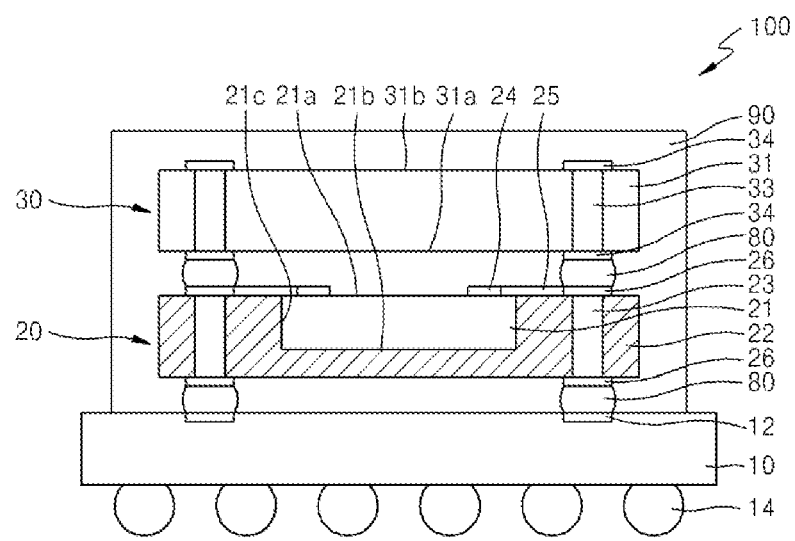
FIG. 1 is a cross-sectional view illustrating a stacked semiconductor package in accordance with one embodiment of the present disclosure.

Reference will now be made in detail to embodiments of the present disclosure, examples of which are illustrated in the accompanying drawings. Embodiments of the present disclosure are offered to illustrate more fully aspects of the present disclosure to person skilled in the art and the following embodiments may be modified in the form of a range of the aspect of the present disclosure, but is not limited to the following embodiments. Rather, these embodiments are provided to further enhance the present disclosure, and to illustrate completely the aspect of the present disclosure to those skilled in the art. As used herein, the term "and/or" includes any combination of one or more with any of the listed items. An Identical numeral refers to like elements throughout the following embodiments. Further, various elements and regions in the drawings are schematically illustrated. Thus, the aspect of the present disclosure is not limited by the thickness and relative size illustrated in the accompanying drawings.

FIG. 1 is a cross-sectional view illustrating a stacked semiconductor package 100 in accordance with one embodiment of the present disclosure.

Referring to FIG. 1, the stacked semiconductor package 100 includes a substrate 10 and a first semiconductor chip structure 20 and a second semiconductor chip structure 30 both of which are stacked in order.

The substrate 10 may include a printed circuit board (PCB), a flexible board, a tape board, and the like. The substrate 10 may include glass, ceramic, plastic or polymer. The substrate 10 may further include a substrate pad 12 in which the first semiconductor chip structure 20 and the second semiconductor chip structure 30 are electrically connected to. The substrate 10 may further include an external connection member 14 in which the first semiconductor chip structure 20 and the second semiconductor chip structure 30 electrically connect to the outside. The external connection member 14 may be electrically connected to the substrate pad 12. The external connection member 14 may adopt a solder ball.

The first semiconductor structure 20 may include a first semiconductor chip 21, a first mold layer 22 surrounding the first semiconductor chip 21 and a first penetration electrode 23 passing through the first mold layer 22 and being connected to the first semiconductor chip 21.

The second semiconductor structure 30 may include a second semiconductor chip 31, and a second penetration electrode 33 electrically connected to the first penetration electrode 23. According to one embodiment, the second semiconductor chip structure 30 may include the second semiconductor chip 31, and the second penetration electrode 33 may pass through the second semiconductor chip 31.

The second semiconductor structure 30 may be vertically stacked on the first semiconductor structure 20. According to one embodiment, the second semiconductor structure 30 may be vertically stacked on an upper side of the first semiconductor structure 20. In addition, the first semiconductor structure 20 and the second semiconductor structure 30 may have the same size. This will be described in detail with reference to FIGS. 2 and 3.

The first semiconductor chip 21 and the second semiconductor chip 31 may adopt the same type products or the different type products. For example, the first semiconductor chip 21 and the semiconductor chip 31 may be a memory chip or a logic chip. The memory chip may include a dynamic random access memory (DRAM), a static random access memory (SRAM), a flash, a phase change random access memory (PRAM), a resistive random access memory (ReRAM), a ferroelectric random access memory (FeRAM) or a magnetoresistive random access memory (MRAM). The logic chip may be a controller for controlling the memory chip. For example, the first semiconductor chip 21 may be the logic chip including a logic circuit, and the second semiconductor chip 31 may be the memory chip, or vice versa. The stacked semiconductor package 100 may be system on chip (SOC) or system in package (SIP).

The first mold layer 22 may surround the first semiconductor 21. The first mold layer 22 may include an insulating material, such as an epoxy mold compound (EMC). The first semiconductor chip 21 may be exposed from the first molding layer 21, and may include an active surface 21a in which devices (not shown) are formed, an inactive surface 21b embedded in the first molding layer 22, and a side surface 21c. Alternatively, the first mold layer 22 surrounds the side surface 21c of the first semiconductor chip 22, and exposes the active surface 21a and the inactive surface 21b. In the stacked semiconductor package 100, the first semiconductor chip 21 may be formed in face-up structure which the active surface 21a is exposed toward the upper side. The active surface 21a of the first semiconductor chip 21 may be disposed to face the second semiconductor chip 31.

The first semiconductor chip 21 may include a first chip pad 24 on the active surface 21a. The first chip pad 24 may be electrically connected to the elements (not shown) formed on the first semiconductor chip 21. The first chip pad 24 may be electrically connected to a first rerouting pattern 25 formed on the first mold layer 22. The first rerouting pattern 25 may include an electrical conductor, particularly, metal, such copper, copper alloy, aluminum, or aluminum alloy. The first rerouting pattern 25 may be electrically connected to the first penetration electrode 23 through a pad 26. That is, the first rerouting pattern 25 may electrically connect the first penetration electrode 23 to the first chip pad 24. Therefore, the first semiconductor chip 21 may be electrically connected to the substrate 10 through the first chip pad 24, the first rerouting pattern 25, the pad 26, and the first penetration electrode 23. The first semiconductor chip 21 is connected to the first rerouting pattern 25 so that the second semiconductor chip structure 30 may have a fan out structure.

The second semiconductor chip structure 30 may be electrically connected to the substrate 10 through a second chip pad 34 and a bump 80. Particularly, the second semiconductor chip 31 may be electrically connected to the pad 26 through the second chip pad 34 and the bump 80, and then may be electrically connected to the substrate 10 through the first penetration electrode 23, the pad 26, and the bump 80.

In addition, the second semiconductor chip structure 30 may be electrically connected to the first semiconductor chip structure 20 through the second chip pad 34 and the bump 80. Particularly, the second semiconductor chip 31 may be electrically connected to the pad 26 through the second chip pad 34 and the bump 80, and then may be electrically connected to the first semiconductor chip 21 through the first chip pad 24.

The second semiconductor chip 31 may include a first surface 31a and a second surface 31b, both of which are opposite to each other. In a case when the first surface 31a of the second semiconductor chip 31 is an active surface, the second semiconductor chip 31 may have an electrical connection, as mentioned above. Alternatively, in a case when the second surface 31b of the second semiconductor chip 31 is an active surface, elements (not shown) formed on the active surface may be electrically connected to the substrate 10 through the second penetration electrode 33.

The first penetration electrode 23 and the second penetration electrode 33 may be disposed at the same position to be connected to each other through the bump 80. Herein, being disposed at the same position may mean that the first penetration electrode 23 and the second penetration electrode 33 are disposed in a vertical line with respect to the substrate 10, and may mean to be two dimensionally disposed in the same coordinates. That is, a footprint of the first penetration electrode 23 and a footprint of the second penetration electrode 33 are the same.

Optionally, the stacked semiconductor package 100 may further include an external sealing member 90 sealing the first semiconductor chip structure 20 and the second semiconductor chip structure 30. The external sealing member 90 may include an insulating material, such as an epoxy molding compound. The external sealing member 90 may include a material identical to the first mold layer 22 or a material different from the first mold layer 22.

A case of a plurality of the second semiconductor chip structures 30 being stacked on the first semiconductor chip structures 20 is included in an aspect of the present disclosure.

Figure 2:
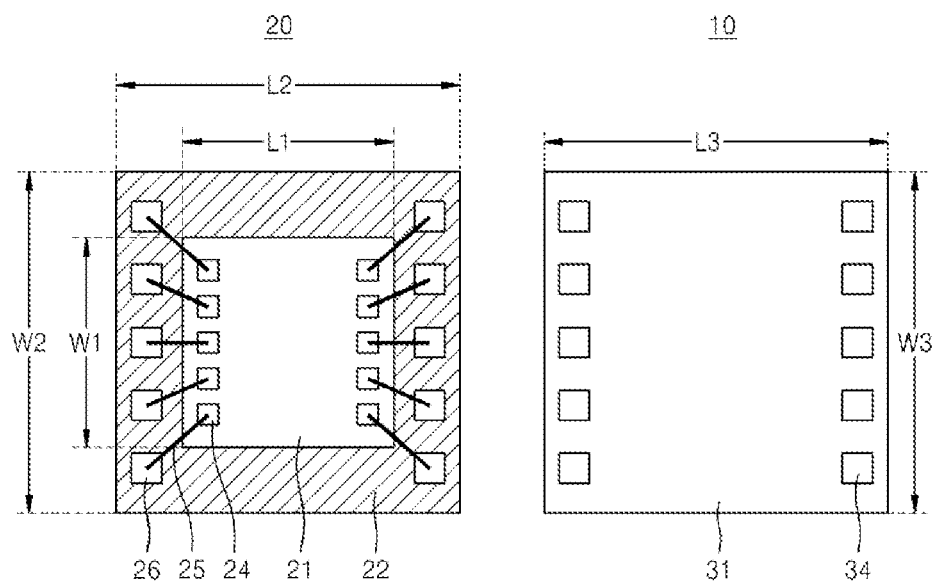
FIGS. 2 and 3 are top views illustrating a first and a second semiconductor chip structure provided in the stacked semiconductor package of FIG. 1 in accordance with one embodiment of the present disclosure.
Figure 3:
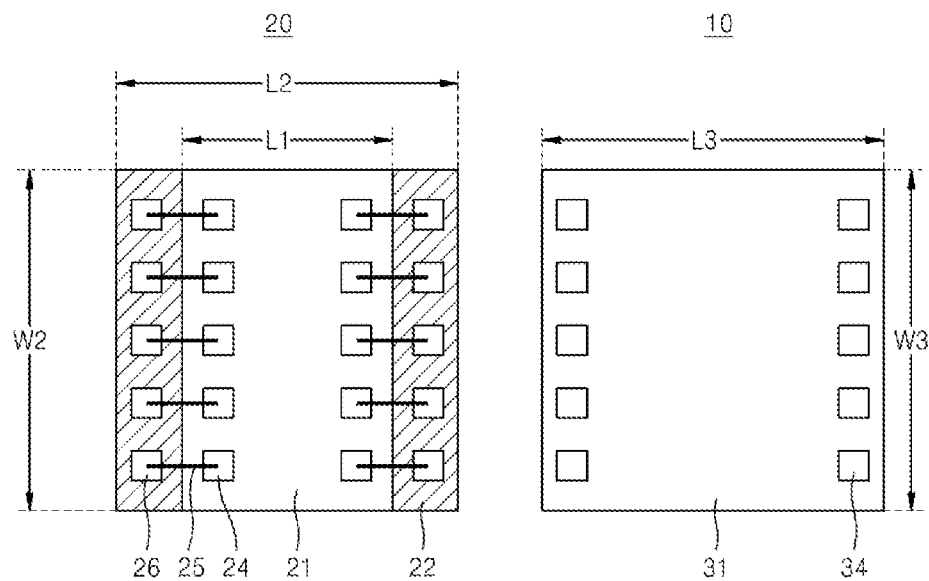

FIGS. 2 and 3 are top views illustrating a first semiconductor chip structure 20 and a second semiconductor chip structure 30 provided in the stacked semiconductor package 100 of FIG. 1 in accordance with one embodiment of the present disclosure.

As referring to FIG. 2, at least one side of the first mold layer 22 of the first semiconductor chip structure 20 may have the same size as at least one side of the second semiconductor chip structure 30.

In the first semiconductor chip structure 20, the first chip pad 24 of the first semiconductor chip 21 may be electrically connected to the pad 26 on the first mold layer 22 through the first rerouting pattern 25. The first semiconductor chip 21 may have a length (L1) and a width (W1). The length (L1) and the width (W1) may be the same or different.

The first mold layer 22 may surround the first semiconductor chip 21. The first mole layer 22 may have a length (L2) and a width (W2), which the length (L2) is longer than the length (L1) of the first semiconductor chip 21 and the width (W2) is wider than the width (W1) of the first semiconductor chip 21. The length (L2) and the width (W2) may be the same or different.

The second semiconductor structure 30 may have a length (L3) and a width (W3). The length (L3) and the width (W3) may be the same or different. According to one embodiment of the present disclosure, the second semiconductor chip structure 30 may include the second semiconductor chip 31

The length (L2) of the first mold layer 22 may be same as the length (L3) of the second semiconductor chip structure 30, and the width (W2) of the first mold layer 22 may be same as the width (W3) of the second semiconductor chip structure 30. Therefore, the first semiconductor chip structure 20 may have the same size as the second semiconductor chip structure 30. That is, when the first semiconductor chip 21 is smaller than the second semiconductor chip 31, the first semiconductor chip structure 20 and the second semiconductor chip structure 30, both of which are stacked to each other, may have the same size by providing the first mold layer 22 surrounding the first semiconductor 21.

Referring to FIG. 3, one side of the first semiconductor chip 21 may have the same size as one side of the second semiconductor chip 31. In addition, one side of the first mold layer 22 of the first semiconductor chip structure 20 may have the same size as the other side of the second semiconductor chip structure 30.

The first semiconductor chip structure 20 may include the first semiconductor chip 21 having a length (L1) and the first mold layer 22 having a length (L2), which is longer than the length (L1). Alternatively, a width of the first semiconductor chip 21 and a width of the first mold layer 22 may be same as a width (W2). In addition, the second semiconductor chip structure 30 may have a length (L3) and a width (W3). The length (L2) of the first mold layer 22 may be the same as the length (L3) of the second semiconductor chip structure 30, and the width (W2) of the first mold layer 22 may be the same as the width (W3) of the second semiconductor chip structure 30.

FIGS. 4 to 13 are cross-sectional views illustrating stacked semiconductor packages 200, 300, 400, 500, 600, 700, 800, 900, 1000, and 1100 accordance with one embodiment of the present disclosure. The stacked semiconductor packages 200, 300, 400, 500, 600, 700, 800, 900, 1000, and 1100 accordance with one embodiment of the present disclosure, are obtained by partially modifying the configuration of the stacked semiconductor package, as mentioned above, thus descriptions of the same parts of the stacked semiconductor package will be omitted.

Figure 4:
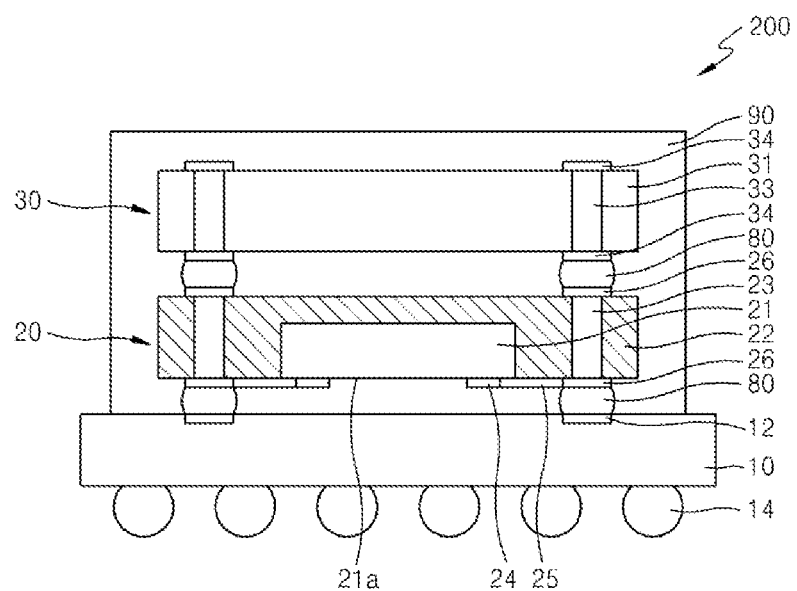
FIGS. 4 to 13 are cross-sectional views illustrating stacked semiconductor packages in accordance with one embodiment of the present disclosure.

Referring to FIG. 4, a staked semiconductor package 200 includes a first semiconductor chip structure 20 and a second semiconductor chip structure 30, both of which are stacked on a substrate 10 in order. Compared to the stacked semiconductor package 100 of FIG. 1, the staked semiconductor package 200 is inversed of the stacked semiconductor package 100. In the staked semiconductor package 200, the first semiconductor chip 21 may have a face-down structure, which an active surface 21a is exposed to the lower side. The active surface 21a of the first semiconductor chip 21 may be disposed to be opposite to a second semiconductor chip 31. In addition, a plurality of the second semiconductor chip structures 30 stacked on the first semiconductor chip structure 20 may be included in the present disclosure.

Figure 5:
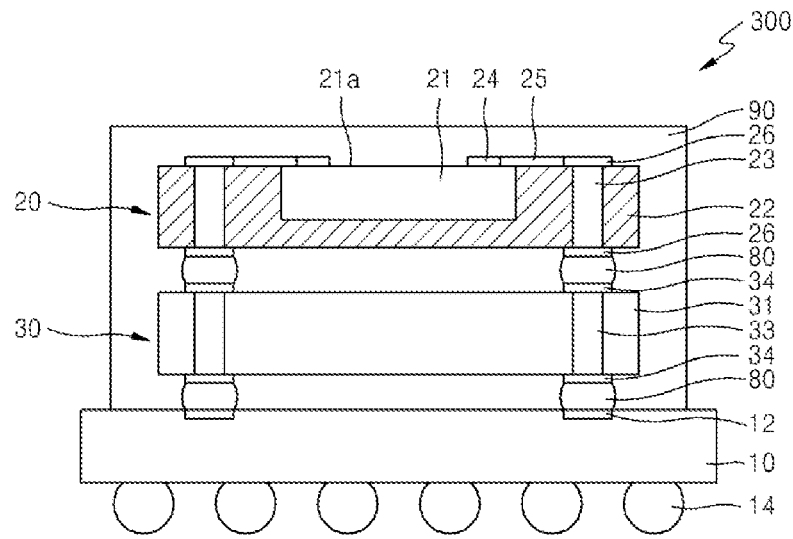

Referring to FIG. 5, a staked semiconductor package 300 includes a first semiconductor chip structure 20 and a second semiconductor chip structure 30, both of which are stacked on a substrate 10 in order. Compared to the stacked semiconductor package 100 of FIG. 1, the staked semiconductor package 300 is a case when a stacking order of the first semiconductor chip structure 20 and the second semiconductor chip structure 30 is reversed. That is, the first semiconductor chip structure 20 may be disposed on an upper side of the second semiconductor chip structure 30. In the staked semiconductor package 300, the first semiconductor chip 21 may have a face-up structure, which an active surface 21a is exposed to the upper side. The active surface 21a of the first semiconductor chip 21 may be disposed to be opposite to a second semiconductor chip 31.

Figure 6:
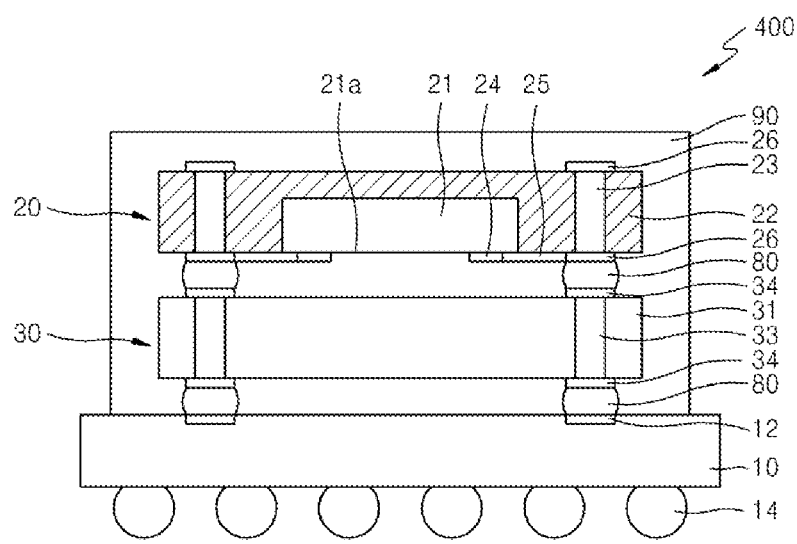

Referring to FIG. 6, a staked semiconductor package 400 includes a first semiconductor chip structure 20 and a second semiconductor chip structure 30, both of which are stacked on a substrate 10 in order. Compared to the stacked semiconductor package 100 of FIG. 1, the staked semiconductor package 400 is a case when a stacking order of the first semiconductor chip structure 20 and the second semiconductor chip structure 30 is reversed and the first semiconductor chip 21 is inversed. In the staked semiconductor package 400, the first semiconductor chip 21 may have a face-down structure, which an active surface 21a is exposed to the lower side. The active surface 21a of the first semiconductor chip 21 may be disposed to be opposite to a second semiconductor chip 31.

Figure 7:
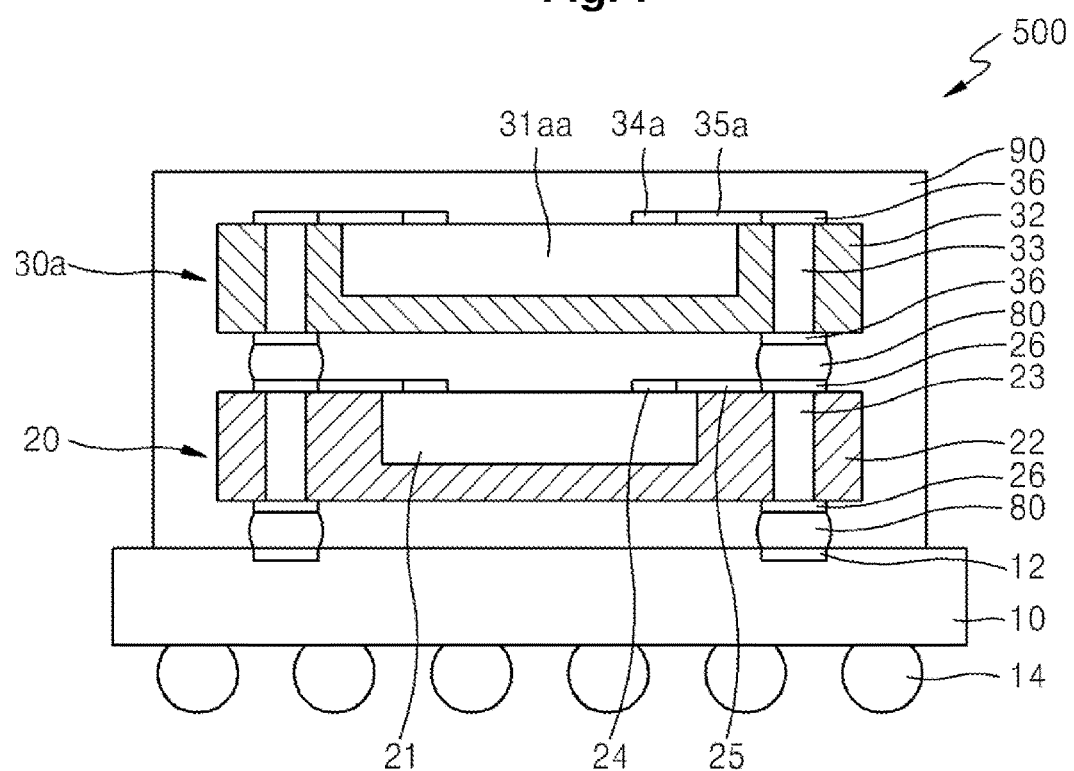

FIG. 7 is a cross-sectional view of the staked semiconductor package 500 in accordance with one embodiment of the present disclosure. The staked semiconductor package 500 in accordance with one embodiment of the present disclosure is obtained by partially modifying the configuration of the stacked semiconductor package, as mentioned above, thus descriptions of the same parts of the stacked semiconductor package will be omitted.

Referring FIG. 7, the stacked semiconductor package 500 includes a first semiconductor chip structure 20 and a second semiconductor chip structure 30a. The first semiconductor chip structure 20 may be the same as the first semiconductor chip structure 20 of the first stacked semiconductor package 100 of FIG. 1.

The second semiconductor chip structure 30a may include a second semiconductor chip 31aa and a second mold layer 32 surrounding the second semiconductor chip 31aa. The second mold layer 32 surrounds the second semiconductor chip 31aa and the first mold layer 22 surrounds the first semiconductor chip 21 so that the second semiconductor chip structure 30a may have the same size as that of the first semiconductor chip structure 20.

The second mold layer 32 may include an insulating material, such as an epoxy mold compound (EMC). The second mold layer 32 may include a material identical to the first mold layer 22 or a material different from the first mold layer 22.

The second semiconductor chip 31 as may include a second chip pad 34a. The second chip pad 34a may be electrically connected to the elements (not shown) formed on the second semiconductor chip 31aa. The second chip pad 34a may be electrically connected to a second rerouting pattern 35a formed on the second mold layer 32. The second rerouting pattern 35a may include a electrical conductor, particularly, metal, such copper, copper alloy, aluminum, or aluminum alloy. The second rerouting pattern 35a may be electrically connected to the second penetration electrode 33 through a pad 36. That is, the second rerouting pattern 35a may electrically connect the second penetration electrode 33 to the second chip pad 34a. The second penetration electrode 33 and the first penetration electrode 23 may be disposed the same position to be electrically connected to each other through a bump 80. The second semiconductor chip 31 as is connected to the second rerouting pattern 35a so that the second semiconductor chip structure 30a may have a fan out structure.

Similarly to the above-mentioned, the direction of the active surface of the first semiconductor chip 21 and the second semiconductor chip 31 as may be varied in many ways.

Figure 8:
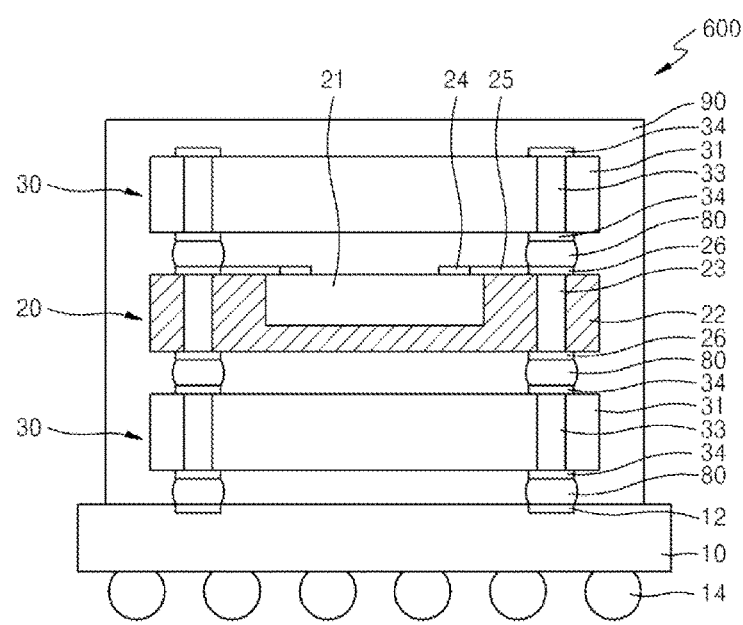

Referring to FIG. 8, a stacked semiconductor package 600 includes a second semiconductor chip structure 30, a first semiconductor chip structure 20, and a second semiconductor chip structure 30, all of which are stacked on a substrate 10 in order. That is, the stacked semiconductor package 600 is a case when the second semiconductor chip structure 30 is more stacked on the first semiconductor chip structure 20 of the stacked semiconductor package 300 of FIG. 5. The second semiconductor chip structure 30 stacked on the first semiconductor chip structure 20 may be electrically connected to the substrate 10 through the first penetration electrode 23 of the first semiconductor chip structure 20.

Figure 9:
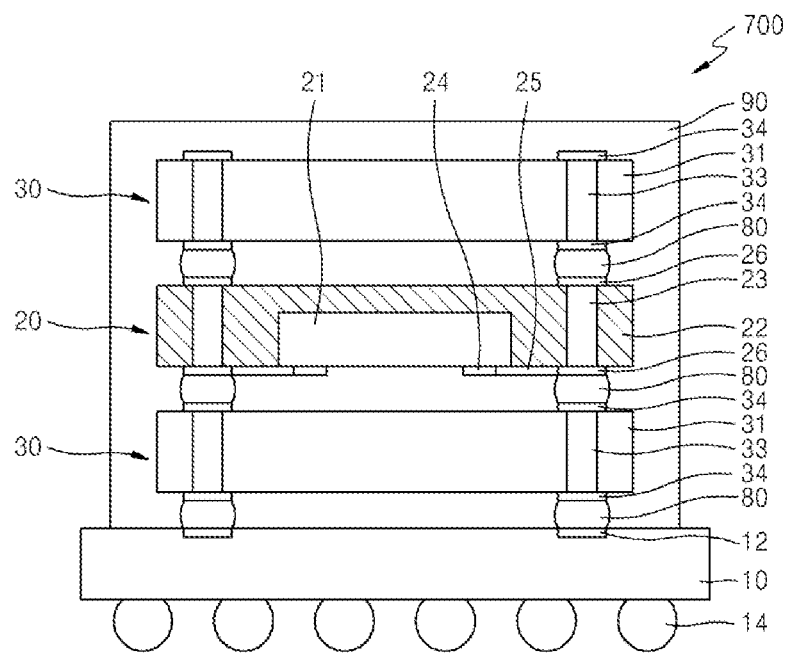

Referring to FIG. 9, a stacked semiconductor package 700 includes a second semiconductor chip structure 30, a first semiconductor chip structure 20, and a second semiconductor chip structure 30, all of which are stacked on a substrate 10 in order. That is, the stacked semiconductor package 700 is a case when the second semiconductor chip structure 30 is more stacked on the first semiconductor chip structure 20 of the stacked semiconductor package 400 of FIG. 6. The second semiconductor chip structure 30 stacked on the first semiconductor chip structure 20 may be electrically connected to the substrate 10 through the first penetration electrode 23 of the first semiconductor chip structure 20.

Figure 10:
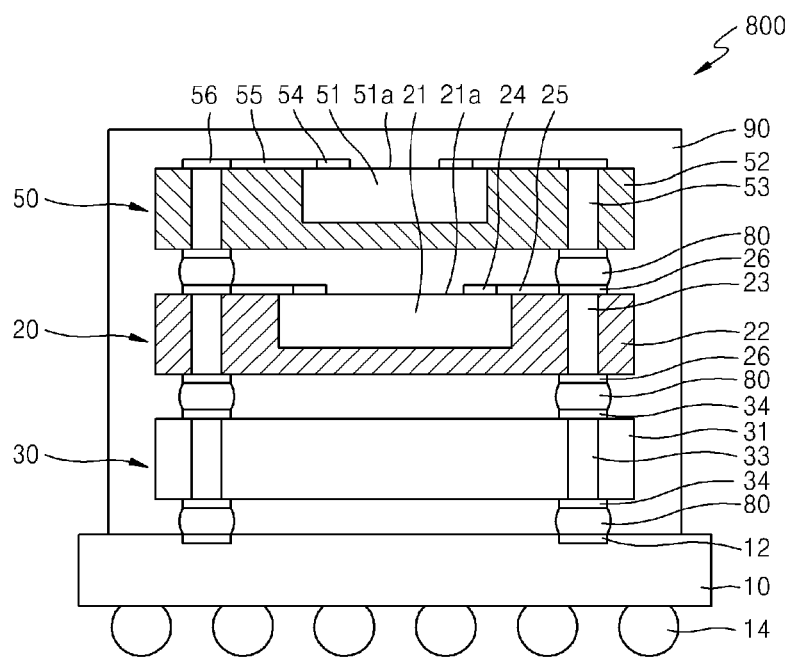

Referring to FIG. 10, a staked semiconductor package 800 includes a first semiconductor chip structure 20, a second semiconductor chip structure 30, and a third semiconductor chip structure 50 stacked on the upper side of the first semiconductor chip structure 20. The third semiconductor chip structure 50 may have the same size as at least any one of the first semiconductor chip structure 20, and the second semiconductor chip structure 30.

The third semiconductor chip structure 50 may include a third semiconductor chip 51, a third mold layer 52 surrounding the third semiconductor chip 51, and a third penetration electrode 53 passing through the third mold layer 53 and being connected to the third semiconductor chip 51.

The third semiconductor chip 51 may be a memory chip or a logic chip. The third semiconductor chip 51 may adopt the same type products or the different type products as the first semiconductor chip 21 or the first semiconductor chip 31. The third semiconductor chip 51 may be larger, smaller, or same size as the first semiconductor chip 21. Alternatively, the third semiconductor chip 51 may be larger, smaller, or same as the second semiconductor chip 31.

The third mold layer 52 may include an insulating material, such as an epoxy mold compound (EMC). The third mold layer 52 may include a material identical to the first mold layer 22 or a material different from the first mold layer 22.

The third semiconductor chip 51 may include a second chip pad 54. The third chip pad 54 may be electrically connected to the elements (not shown) formed on the third semiconductor chip 51. The third chip pad 54 may be electrically connected to a third rerouting pattern 55 formed on the third mold layer 52. The third rerouting pattern 55 may include a electrical conductor, particularly, metal, such copper, copper alloy, aluminum, or aluminum alloy. The third rerouting pattern 55 may be electrically connected to the third penetration electrode 53 through a pad 56. That is, the third rerouting pattern 55 may electrically connect the third penetration electrode 53 to the third chip pad 53. The third penetration electrode 53 and the first penetration electrode 23 may be disposed the same position to be electrically connected to each other through a bump 80. The third semiconductor chip 51 is connected to the third rerouting pattern 55 so that the third semiconductor chip structure 50 may have a fan out structure.

Figure 11:
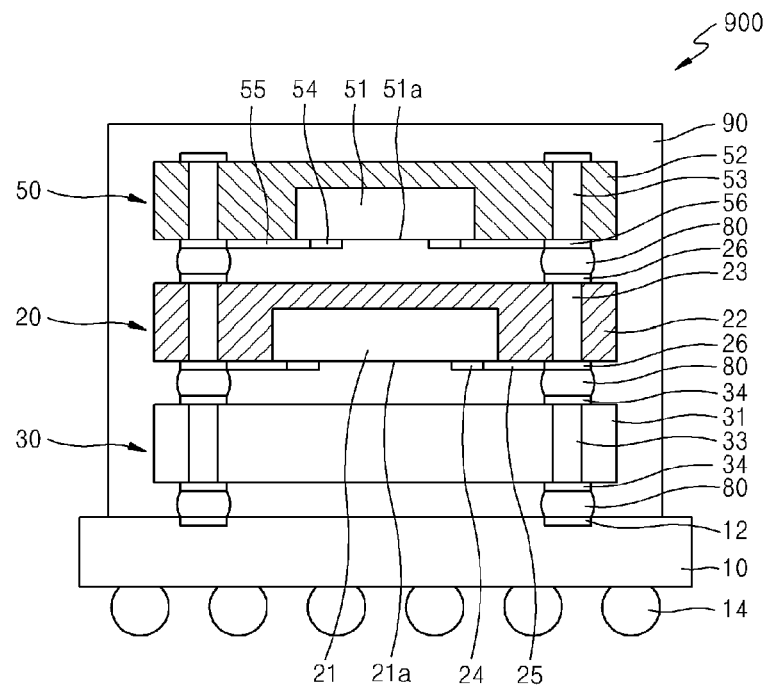
Figure 12:
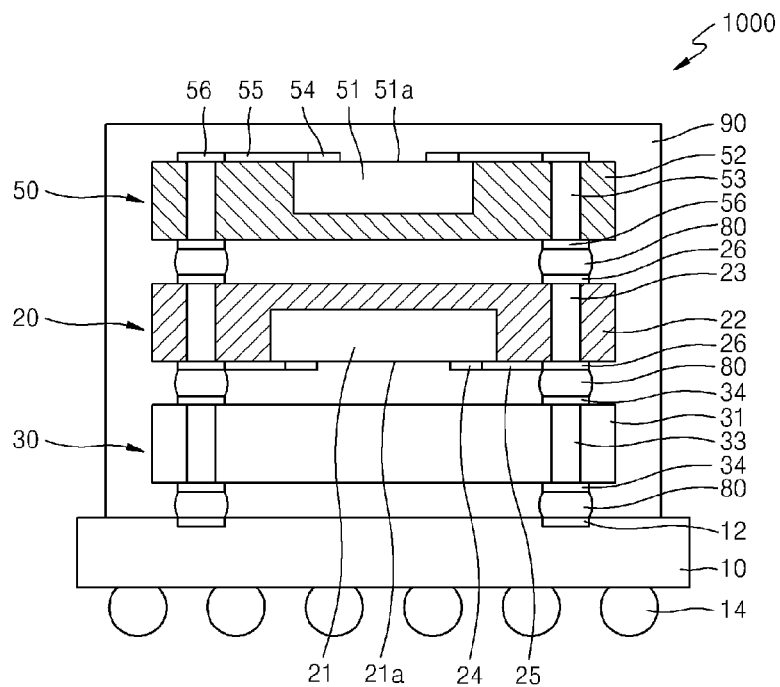
Figure 13:
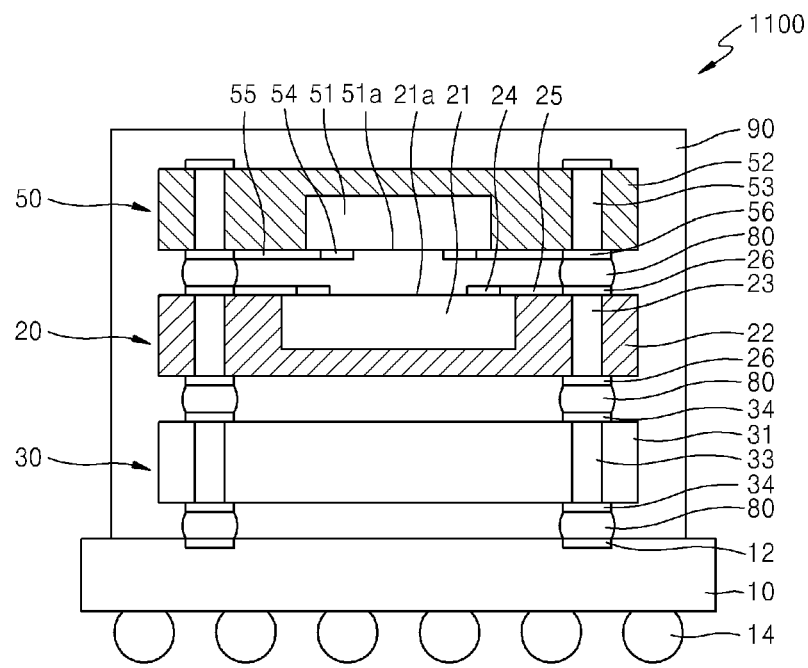

In the stacked semiconductor package 800, the first semiconductor chip 21 may have a face-up structure, which the active surface 21a is exposed toward the upper side, and the third semiconductor chip 51 may have a face-up structure, which the active surface 51a is exposed toward the upper side FIGS. 11 to 13 illustrate examples which the active surface of the first semiconductor chip 21 and the active surface of the third semiconductor chip 51 have different directions to each other in the stacked semiconductor package 800 of FIG. 10.

Referring to FIG. 11, in the stacked semiconductor package 900, the first semiconductor chip 21 may have a face-down structure, which the active surface 21a is exposed toward the lower side, and the third semiconductor chip 51 may have a face-down structure, which the active surface 51a is exposed toward the lower side.

Referring to FIG. 12, in the stacked semiconductor package 1000, the first semiconductor chip 21 may have a face-down structure, which the active surface 21a is exposed toward the lower side, and the third semiconductor chip 51 may have a face-up structure, which the active surface 51a is exposed toward the upper side.

Referring to FIG. 13, in the stacked semiconductor package 1100, the first semiconductor chip 21 may have a face-up structure, which the active surface 21a is exposed toward the upper side, and the third semiconductor chip 51 may have a face-down structure, which the active surface 51a is exposed toward the lower side.

Figure 14:
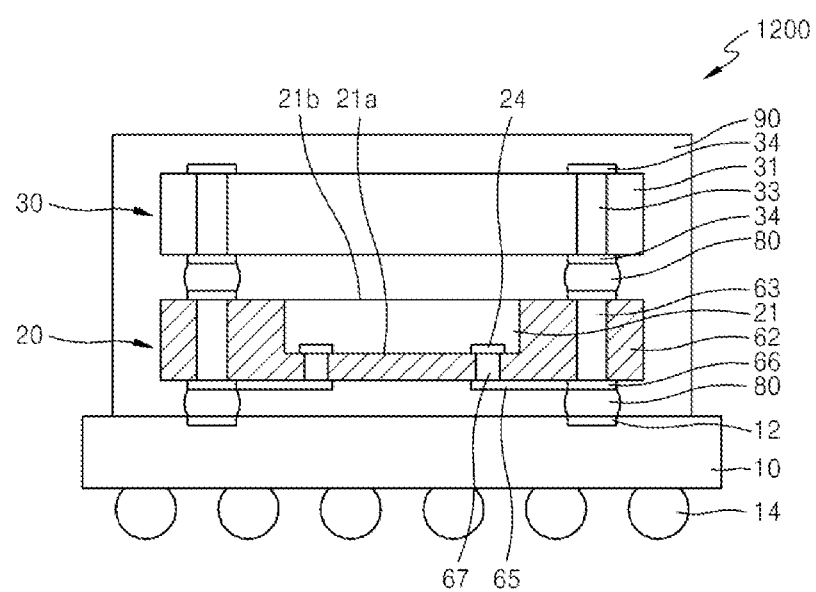

FIGS. 14 and 15 are cross-sectional views of staked semiconductor packages 1200 and 1300 in accordance with one embodiment of the present disclosure. The staked semiconductor packages 1200 and 1300 in accordance with one embodiment of the present disclosure are obtained by partially modifying the configuration of the stacked semiconductor package, as mentioned above, thus descriptions of the same parts of the stacked semiconductor package will be omitted.

Referring to FIG. 14, a staked semiconductor package 1200 includes a substrate 10, a first semiconductor chip structure 20 and a second semiconductor chip structure 30, both of which are stacked on the substrate 10 in order. The first semiconductor chip structure 20 may include a fourth mold layer 62. Therefore, the first semiconductor chip 21 may be inserted into the fourth mold layer 62. The fourth mold layer 62 may be a pre-formed substrate, such as an interposer.

The fourth mold layer 62 may include a fourth penetration electrode 67 inside thereof, and the fourth penetration electrode 67 may be electrically connected to the first chip pad 24 of the first semiconductor chip 21. The fourth penetration electrode 67 may be electrically connected to a fourth rerouting pattern 65, and the fourth rerouting pattern 65 may be electrically connected to a fourth pad 66. The fourth rerouting pattern 65 may include a electrical conductor, particularly, metal, such copper, copper alloy, aluminum, or aluminum alloy. Therefore, the first semiconductor chip 21 may be electrically connected to the substrate 10 through the fourth penetration electrode 67, the fourth rerouting pattern 65, and the fourth pad 66. In addition, a fifth penetration electrode 63 may act as the second penetration electrode 33 of FIG. 1, thus the second semiconductor chip 31 of the second semiconductor chip structure 30 may be electrically connected to the substrate 10 through the fifth penetration electrode 63.

According to one embodiment of the present disclosure, the first semiconductor chip 21 may have a face-down structure, which is the active surface 21a is toward the lower side and connected to the fourth penetration electrode 67. A top surface of the fourth mold layer 62 and a top surface of the first semiconductor chip 21 may be or be not on the same plane.

Alternatively, the first semiconductor chip 21 may be a dummy chip. In addition, the fourth mold layer 62 may redistribute the second semiconductor chip structure 30.

Referring to FIG. 15, a staked semiconductor package 1300 includes a substrate 10, a first semiconductor chip structure 20 and a second semiconductor chip structure 30, both of which are stacked on the substrate 10 in order. The first semiconductor chip structure 20 may include a fourth mold layer 62. Therefore, the first semiconductor chip 21 may be inserted into the fourth mold layer 62. The fourth mold layer 62 may be a pre-formed substrate, such as an interposer.

The fourth mold layer 62 may include a fourth penetration electrode 67 inside thereof, and the fourth penetration electrode 67 may be electrically connected to the first chip pad 24 of the first semiconductor chip 21. Herein, the first semiconductor chip 21 may include a sixth penetration electrode 68 electrically connecting the fourth penetration electrode 67 to the first chip pad 24.

Therefore, the first semiconductor chip 21 may be electrically connected to the substrate 10 through the sixth penetration electrode 68, the fourth penetration electrode 67, the fourth rerouting pattern 65, and the fourth pad 66. In addition, the fifth penetration electrode 63 may act as the second penetration electrode 33 of FIG. 1, thus the second semiconductor chip 31 of the second semiconductor chip structure 30 may be electrically connected to the substrate 10 through the fifth penetration electrode 63.

According to one embodiment of the present disclosure, the first semiconductor chip 21 may have a face-up structure, which is the active surface 21a is toward the upper side and connected to the fourth penetration electrode 67. A top surface of the fourth mold layer 62 and a top surface of the first semiconductor chip 21 may be or be not on the same plane.

Alternatively, the first semiconductor chip 21 may be a dummy chip. In addition, the fourth mold layer 62 may redistribute the second semiconductor chip structure 30.

The stacked semiconductor packages illustrated in FIGS. 1 to 15 have a configuration in which two or three semiconductor chip structure are stacked, but this is an example. A case where four semiconductor chip structures or more than that are stacked is defined in the aspect of the present disclosure.

FIGS. 16 to 21 are cross-sectional views illustrating the step of a manufacturing method of the stacked semiconductor package 100 of FIG. 1 in accordance with one embodiment of the present disclosure.

Referring to FIG. 16, a first mold layer 22 surrounding a plurality of a first semiconductor chip 21 is formed. As mentioned above, the first semiconductor chip 21 is disposed to be predetermined position so that a separate first semiconductor chip structure 20 (refer to FIG. 19) in which the first semiconductor chip 21 is surrounded by the first mold layer 22 is the same size as a separate second semiconductor chip structure 30 (refer to FIG. 20).

Referring to FIG. 17, a first penetration electrode passing through the first mold layer 22 is formed. At this step, after forming an opening passing through the first mold layer 22, the opening is filled with to an electrical conductor to form the first penetration electrode 23. As mentioned above, the first penetration electrode 23 may be disposed to be the same position as the second penetration electrode 33 (refer to FIG. 19) of the second semiconductor chip structure 30 (refer to FIG. 19).

Referring to FIG. 18, a first rerouting pattern 25 connecting the first semiconductor chip 21 to the first penetration electrode 23, and a pad 26 are formed on the first mold layer 22. The first rerouting pattern 25 and the pad 26 may be formed through various ways, such as evaporation, plating, and the like. Accordingly, the first semiconductor chip structure 20 having a plurality of the first semiconductor chip 21 may be formed.

Referring to FIG. 19, the second semiconductor chip structure 30 having the second semiconductor chip 31 and the second penetration electrode 33 are staked on the first mold layer 22. In addition, the first penetration electrode 23 of the first semiconductor chip structure 20 is electrically connected to the second penetration electrode 33 of the second semiconductor chip structure 30. The connection of the first penetration electrode 23 and the second penetration electrode 33 may be realized by a reflow process. The first penetration electrode 23 and the second penetration electrode 33 are disposed on the same position. Accordingly, the first semiconductor chip structure 20 and the second semiconductor chip structure 30 may be staked vertically, and the first penetration electrode 23 and the second penetration electrode 33 may be stacked by corresponding to each other. As mentioned above, a case where the stacking order of the first semiconductor chip structure 20 and the second semiconductor chip structure 30 is reversed is defined in the aspect of the present disclosure.

The stacking of the first semiconductor chip structure 20 and the second semiconductor chip structure 30 may be realized by a wafer level stack technology, which is stacked as a form of a wafer.

Referring to FIG. 20, the stacked object having the first semiconductor chip structure 20 and the second semiconductor chip structure 30 is divided.

Referring to FIG. 21, the substrate 10 is installed on a lower side of the first semiconductor chip structure 20, and the first semiconductor chip structure 20 and the substrate 10 are electrically connected to each other. Optionally, a sealing member 90 for sealing the first semiconductor chip structure 20 and the second semiconductor chip structure 30 is formed so that the staked semiconductor package 100 is completed.

Although a few embodiments of the present disclosure have been shown and described, it would be appreciated by those skilled in the art that changes may be made in these embodiments without departing from the principles and spirit of the disclosure, the scope of which is defined in the claims and their equivalents.

The invention claimed is:

1. A stacked semiconductor package comprising:
a first semiconductor chip structure provided with a first semiconductor chip, a first mold layer surrounding the first semiconductor chip, and a first penetration electrode passing through the first mold layer and electrically connected to the first semiconductor chip; and
a second semiconductor chip structure vertically stacked on the first semiconductor chip structure and provided with a second semiconductor chip and a second penetration electrode passes through the second semiconductor chip electrically connected to the first penetration electrode, wherein the first penetration electrode and the second penetration electrode are disposed on the same position,
wherein the first semiconductor chip has a different width from the second semiconductor chip and the first mold layer has the same width as the second semiconductor chip so that the first semiconductor chip structure has the same width as the second semiconductor chip structure.

2. The stacked semiconductor package of claim 1, wherein at least one side of the first mold layer has the same width as at least one side of the second semiconductor chip structure.

3. The stacked semiconductor package of claim 1, wherein one side of the first semiconductor chip has the same width as one side of the second semiconductor chip.

4. The stacked semiconductor package of claim 1, wherein the first semiconductor chip structure is stacked to be disposed on the upper side of the second semiconductor chip structure.

5. The stacked semiconductor package of claim 1, wherein the second semiconductor chip structure is stacked to be disposed on the upper side of the first semiconductor chip structure.

6. The stacked semiconductor package of claim 1, wherein an active surface of the first semiconductor chip is disposed to face the second semiconductor chip.

7. The stacked semiconductor package of claim 1, wherein an active surface of the first semiconductor chip is disposed to be opposite to the second semiconductor chip.

8. The stacked semiconductor package of claim 1, wherein the first semiconductor chip comprises a first chip pad, and the first semiconductor chip structure further comprises a rerouting pattern configured to connect the first chip pad of the first semiconductor chip to the first penetration electrode and formed on the first mold layer.

9. The stacked semiconductor package of claim 1, wherein the second semiconductor chip structure further comprises a second mold layer surrounding the second semiconductor chip.

10. The stacked semiconductor package of claim 1, wherein the stacked semiconductor package further comprises a third semiconductor chip structure vertically stacked on the first semiconductor chip structure or the second semiconductor chip structure, wherein the third semiconductor chip structure has the same width as the first semiconductor chip structure or the second semiconductor chip structure.

11. The stacked semiconductor package of claim 10, wherein the third semiconductor chip structure comprises a third semiconductor chip, a third mold layer surrounding the third semiconductor chip, and a third penetration electrode passing through the third mold layer.

12. The stacked semiconductor package of claim 11, wherein the third semiconductor chip has a different width from at least one of the first semiconductor chip and the second semiconductor chip.

13. A manufacturing method for a stacked semiconductor package comprising:
forming a first mold layer surrounding a first semiconductor chip, forming a first penetration electrode passing through the first mold layer, forming a stacked semiconductor package by forming a rerouting pattern on the first mold layer to connect the first penetration electrode to the first chip pad,
stacking a second semiconductor chip structure having a second semiconductor chip and a second penetration electrode on the first semiconductor chip structure, wherein the second penetration electrodes passes through the second semiconductor chip and
electrically connecting the first penetration electrode of the first semiconductor chip structure to the second penetration electrode of the second semiconductor chip structure, wherein the first semiconductor chip has a different width from the second semiconductor chip and the first mold layer has the same width as the second semiconductor chip so that the first semiconductor chip structure has the same width as the second semiconductor chip.

14. A stacked semiconductor package comprising:
a first semiconductor chip structure provided with a first semiconductor chip, a first mold layer surrounding the first semiconductor chip, and a first penetration electrode passing through the first mold layer and electrically connected to the first semiconductor chip; and
a second semiconductor chip vertically stacked on the first semiconductor chip structure and provided with a second penetration electrode electrically connected to the first penetration electrode, wherein the second penetration electrode passes through the second semiconductor chip,
wherein the first semiconductor chip and the second semiconductor chip have different width and the first mold layer has the same width as the second semiconductor chip so that the first semiconductor chip structure has the same width as the second semiconductor chip structure, and at least one side of the first mold layer has the same width as at least one side of the second semiconductor chip.

15. The stacked semiconductor package of claim 14, further comprising an external sealing member sealing the first semiconductor chip structure and the second semiconductor chip.

16. The stacked semiconductor package of claim 15, wherein the external sealing member includes a material same as the first mold layer.

17. The stacked semiconductor package of claim 15, wherein the external sealing member includes a material different from the first mold layer.

* * * * *